(12) United States Patent
Elmala et al.

(10) Patent No.: US 7,456,720 B2
(45) Date of Patent: Nov. 25, 2008

(54) ON-DIE COUPLED INDUCTOR STRUCTURES FOR IMPROVING QUALITY FACTOR

(75) Inventors: Mostafa Elmala, Tigard, OR (US); Jeyanandh K Paramesh, Seattle, OR (US)

(73) Assignee: Intel Corporation, Santa Clara, CA (US)

( * ) Notice: Subject to any disclaimer, the term of this patent is extended or adjusted under 35 U.S.C. 154(b) by 355 days.

(21) Appl. No.: 11/130,596

(22) Filed: May 17, 2005

(65) Prior Publication Data

US 2006/0262573 A1   Nov. 23, 2006

(51) Int. Cl.
*H01F 5/00* (2006.01)

(52) U.S. Cl. .................................................. 336/200
(58) Field of Classification Search ................... 336/200
See application file for complete search history.

(56) References Cited

U.S. PATENT DOCUMENTS

| | | | | |
|---|---|---|---|---|
| 6,023,161 A * | 2/2000 | Dantsker et al. | ............ | 324/248 |
| 6,396,362 B1 * | 5/2002 | Mourant et al. | ............... | 333/25 |
| 6,759,937 B2 * | 7/2004 | Kyriazidou | ................. | 336/200 |

\* cited by examiner

*Primary Examiner*—Elvin G Enad
*Assistant Examiner*—Joselito Baisa
(74) *Attorney, Agent, or Firm*—The Law Offices of John C. Scott, LLC; John C. Scott

(57) ABSTRACT

On-die coupled inductor structures are disclosed that are capable of reducing the occurrence of charge crowding within the structure.

21 Claims, 9 Drawing Sheets

ON-DIE COUPLED INDUCTOR STRUCTURES FOR IMPROVING QUALITY FACTOR

TECHNICAL FIELD

The invention relates generally to microelectronic circuits and, more particularly, to on-die coupled inductor structures.

BACKGROUND OF THE INVENTION

Coupled inductors are used in many radio frequency (RF) circuit designs, including low noise amplifiers (LNAs), mixers, power amplifiers, and others. When implemented on-die, coupled inductors have been known to suffer from current crowding effects that reduce the quality factor (Q) of the structures. That is, the current flowing through a portion of the circuit metallization may be concentrated within less than the overall cross section of the metal in a manner that increases the relative loss (resistance) of the circuit. Circuit techniques and structures are needed that are capable of reducing the occurrence of current crowding in on-die coupled inductors.

DETAILED DESCRIPTION

Figure 1:
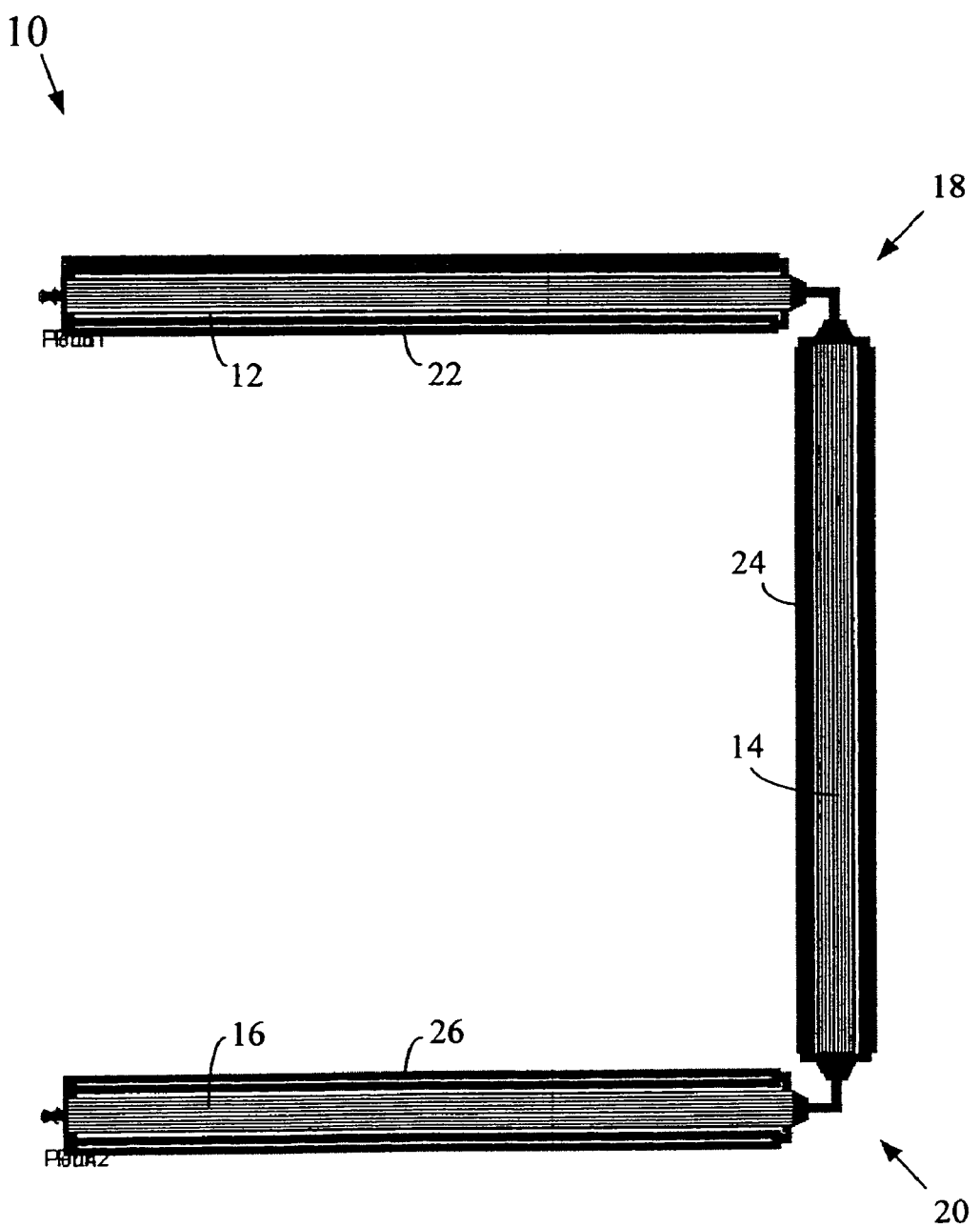
FIG. 1 is a top view of an exemplary coupled inductor structure in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

In higher power RF applications, the conductor elements within circuits typically need to be made larger than in corresponding low power circuits to handle the increased currents. However, effects are known to occur at RF frequencies that lessen the benefit gained by increasing the size of conductors. For example, the skin effect is a phenomenon where alternating currents within a conductor tend to flow near the surface of the conductor, resulting in a non-uniform current density within the conductor. This non-uniform current density may be referred to as current crowding. Because the cross sectional area of the conductor through which current is flowing is effectively reduced, the resistance of the conductor increases and the Q decreases. One method for dealing with current crowding in coupled inductor structures that use strip based transmission lines (e.g., stripline or microstrip technology, etc.) is to divide a single wider conductor strip into a number of narrower parallel conductor strips. In this manner, the current is divided between the various parallel strips and there is less ability for currents to concentrate within a small portion of a single strip.

In microelectronic devices, there is often a need to use 90 degree bends within transmission structures. These bends may be used to, for example, reduce the amount of real estate consumed on a substrate to implement a given structure. In at least one aspect, the present invention relates to techniques and structures for implementing on-die coupled inductor structures that include 90 degree bends, while achieving a relatively high Q. FIG. 1 is a top view of an exemplary coupled inductor structure 10 in accordance with an embodiment of the present invention. The coupled inductor structure 10 is a multi-layer conductive strip based circuit structure that is suitable for use on-die within a microelectronic system. On a first metallization layer, the coupled inductor structure 10 includes first, second, and third inductor portions 12, 14, 16 that are part of a first inductor of the coupled inductor arrangement. As shown, the first and second inductor portions 12, 14 are connected by a first 90 degree bend 18 and the second and third inductor portions 14, 16 are connected by a second 90 degree bend 20. The first, second, and third inductor portions 12, 14, 16 each include a number of relatively narrow parallel strips. The number of strips and the width of the strips may be selected based upon, for example, a maximum current that the composite structure is designed to handle. As described above, because a number of narrower strips are used instead of a single wider strip, the occurrence of current crowding may be reduced.

The coupled inductor structure 10 of FIG. 1 also includes, on a second metallization layer, first, second, and third inductor portions 22, 24, 26 that are part of a second inductor of the coupled inductor arrangement. The second metallization layer is below the first metallization layer described above. In the illustrated embodiment, the first, second, and third inductor portions 22, 24, 26 on the second metallization layer, like the corresponding portions 12, 14, 16 on the first layer, also include multiple parallel strips to reduce the occurrence of current crowding. The position of the strips on the second metallization layer relative to the strips on the first layer is selected to achieve a desired coupling coefficient (K) between the first and second inductors of the coupled inductor structure 10. As shown in FIG. 1, the strips forming the first, second, and third inductor portions 22, 24, 26 on the second metallization layer are not directly beneath the strips forming the first, second, and third inductor portions 12, 14, 16 on the first metallization layer, but are laterally offset from the portions on the first layer in the illustrated embodiment. If stronger coupling is desired, however, the lower strips could be moved inwards to a region that is partially or fully beneath the strips on the first layer. The inductor portions 22, 24, 26 on the second metallization layer also have 90 degree bends 18, 20 between adjacent pairs.

In conceiving the present invention, it was appreciated that to ensure optimal performance, each of the parallel strips that are used to form an inductor portion in a coupled inductor arrangement must present substantially the same impedance to current flow as the other parallel strips in the inductor portion. Otherwise, if one or more of the strips have an impedance that is substantially lower than the others, more current will flow through this strip than the other strips, resulting in a situation that is similar to current crowding. To ensure that the parallel strips each have substantially the same impedance, it was determined that the strips must all be of substantially the same length. Embodiments are disclosed herein that are capable of satisfying this length constraint within coupled inductor structures that include one or more 90 degree bends (or bends having other angle values).

Figure 2:
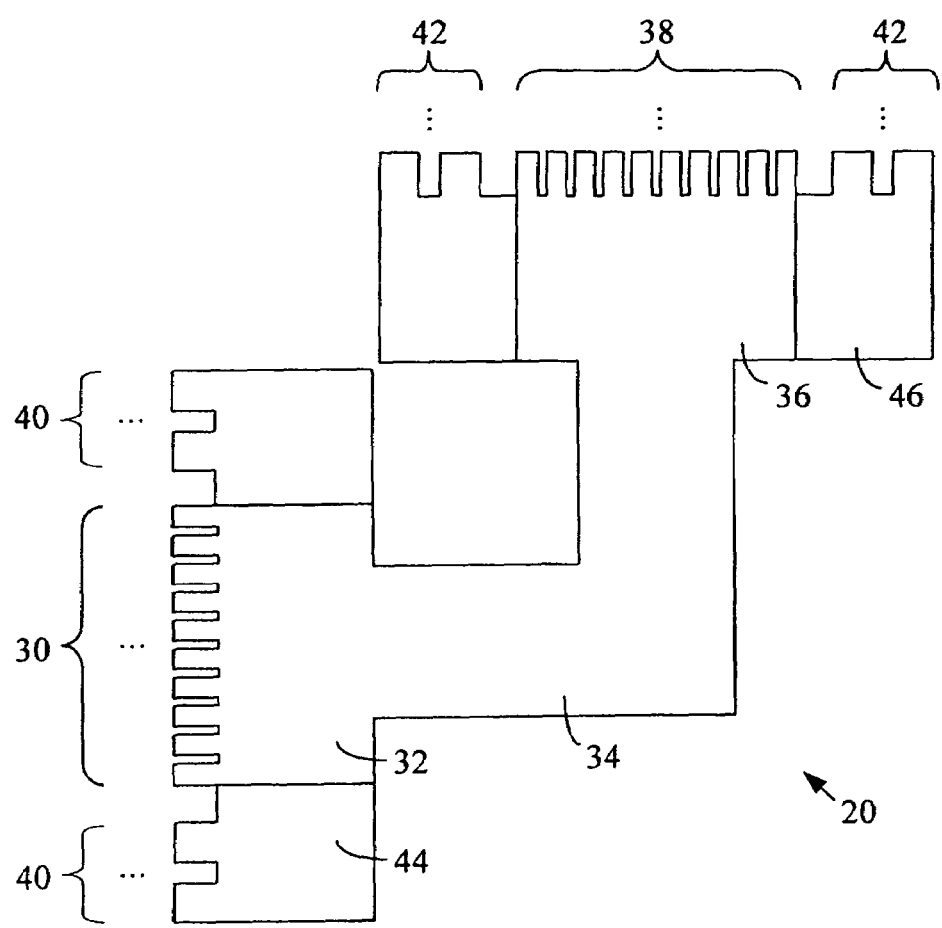
FIGS. 2 and 3 are magnified views of a 90 degree bend portion of the coupled inductor structure of FIG. 1 in accordance with embodiments of the present invention.
Figure 3:
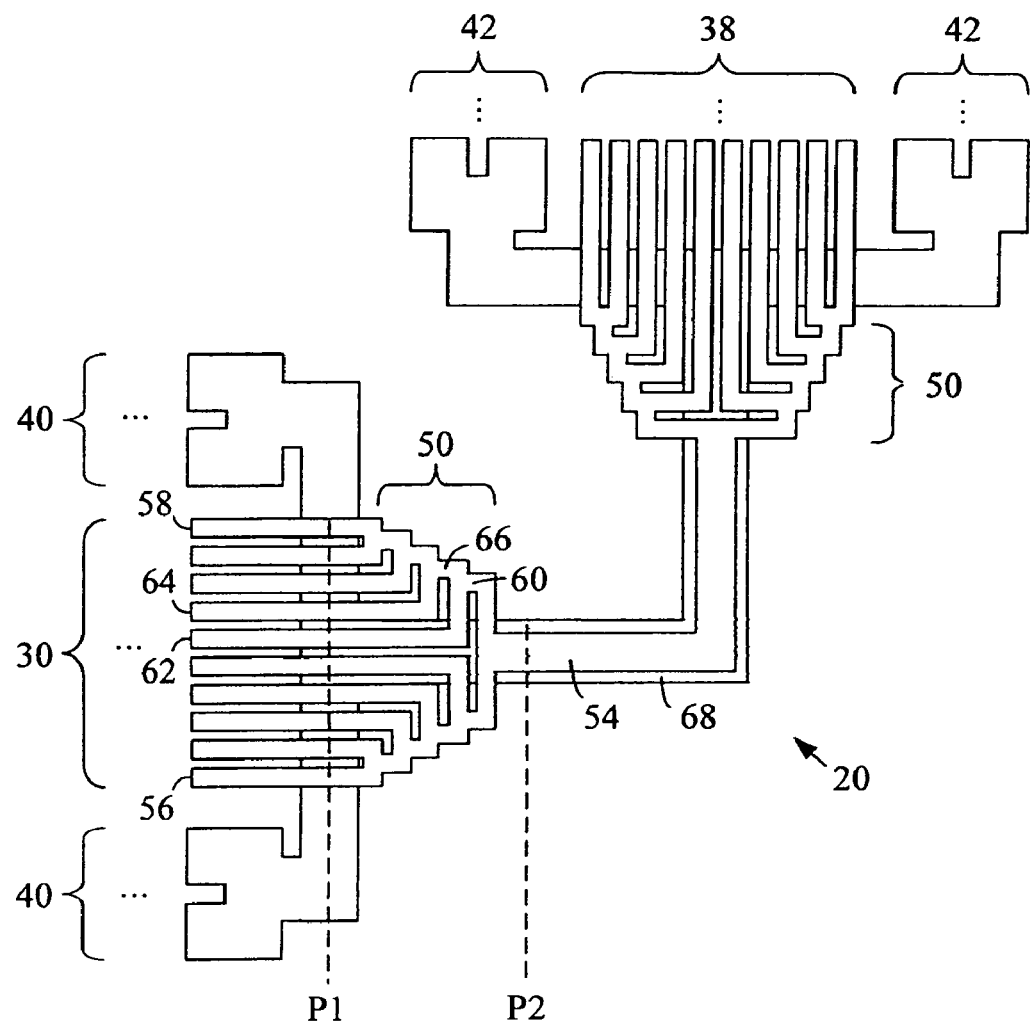

FIGS. 2 and 3 are magnified views of the 90 degree bend portion 20 of the coupled inductor structure 10 of FIG. 1 illustrating two techniques for achieving the above-described length constraint in a 90 degree bend in accordance with embodiments of the present invention. With reference to FIG. 2, in one approach, the parallel strips 30 within inductor portion 16 on the first metallization layer of the coupled inductor structure are all terminated at substantially the same point in a rectangular block 32. That is, the parallel strips are terminated at an edge of the rectangular block 32 that is substantially perpendicular to the parallel strips. The rectangular block 32 is then connected through a single transmission line segment 34, having a conventional (single strip) 90 degree bend, to a second rectangular block 36. The parallel strips 38 within inductor portion 14 on the first metallization layer are all terminated at substantially the same point at an edge of the second rectangular block 36. As shown, the same technique is used with the parallel strips 40 of the inductor portion 26 on the second metallization layer to provide a connection to the parallel strips 42 of the inductor portion 24 on the second metallization layer. That is, the strips 40, 42 are terminated in corresponding blocks 44, 46 that are connected to one another through a single transmission line segment (not shown) having a 90 degree bend. Although the terminating blocks 32, 36, 44, 46 are rectangular in the illustrated embodiment, other shapes may alternatively be used.

Referring now to FIG. 3, in another approach, a unique splitter/combiner arrangement 50 is used to connect the parallel strips 30 on the first metallization layer to a single transmission line segment 54 (i.e., a single strip) having a conventional 90 degree bend. Another splitter/combiner arrangement 50 is used to connect the parallel strips 38 on the first metallization layer to the other end of the transmission line segment 54. The splitter/combiner arrangement 50 is designed so that the effective total length of each of the parallel strips in each group are equal. As shown, in the splitting direction, the splitter/combiner 50 includes a series of nested one-to-two splits from a single input to a number of outputs. Each one-to-two split is done in a manner that maintains the length equivalence between the corresponding strips. For example, with reference to FIG. 3, for strip 56, the electrical path length from line P1 to line P2 is substantially the same as the electrical path length from line P1 to line P2 for any of the other strips 30. In the illustrated embodiment, this is achieved as follows. For each split, the feed point is placed at the midpoint of the outermost strips that will result from the split. Thus, the input feed line (from the end of the transmission line segment 54) is at the midpoint between the outermost strips 56 and 58. Feed 60 to the second one-to-two split on the upper side of the splitter/combiner 50 is at the center point between strip 62 and strip 58 as these are the outermost strips that will eventually result from the second split. Feed 66 to the third one-to-two split on the upper side is at the center point between strip 64 and strip 58 as these are the outermost strips that result from the third split, and so on. Using the above approach, the number of parallel strips will be even. As described above, the number and width of the parallel strips may be selected based upon a known maximum current level that will flow to through the circuit (rounded to the next highest even number for this technique).

As shown in FIG. 3, a series of one-to-two splits may also be used on the second metallization layer to connect the end of transmission line segment 68 to the parallel strips 40 of the second layer. As there are only four strips 40, only two stages of splits are required. As described previously, the desired coupling between the inductor on the first metallization layer and the inductor on the second metallization layer will typically dictate the position of the strips 40 with respect to the strips 30. In the illustrated embodiment, the strips 40 are laterally offset from the strips 30.

Figure 4:
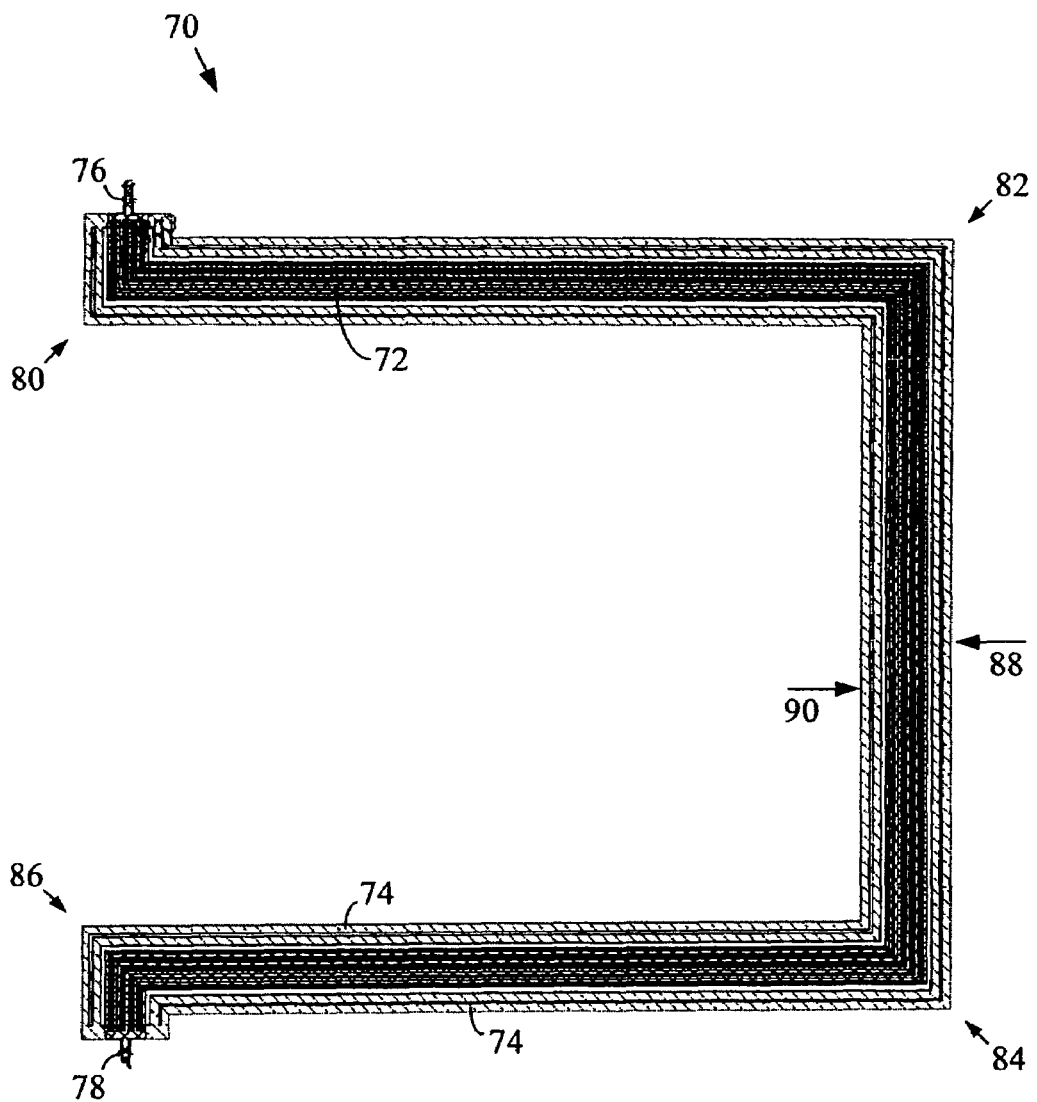
FIG. 4 is a top view of another exemplary coupled inductor structure in accordance with an embodiment of the present invention.

FIG. 4 is a top view of another exemplary coupled inductor structure 70 in accordance with an embodiment of the present invention. The coupled inductor structure 70 is a multi-layer conductive strip based circuit that is suitable for use on-die within a microelectronic system. That is, the coupled inductor structure 70 includes a first inductor 72 having multiple parallel strips on a first metallization layer and a second inductor 74 having multiple parallel strips on a second metallization layer. Terminals 76, 78 of the first and second inductors 72, 74 are located at opposite ends thereof (on respective metallization layers). As shown, the coupled inductor structure 70 has a number of 90 degrees bends 80, 82, 84, 86 within the structure. In addition, the coupled inductor structure 70 does not utilize conventional single conductor 90 degree bends. Instead, the bends include all of the parallel strips of the corresponding inductors.

Figure 5:
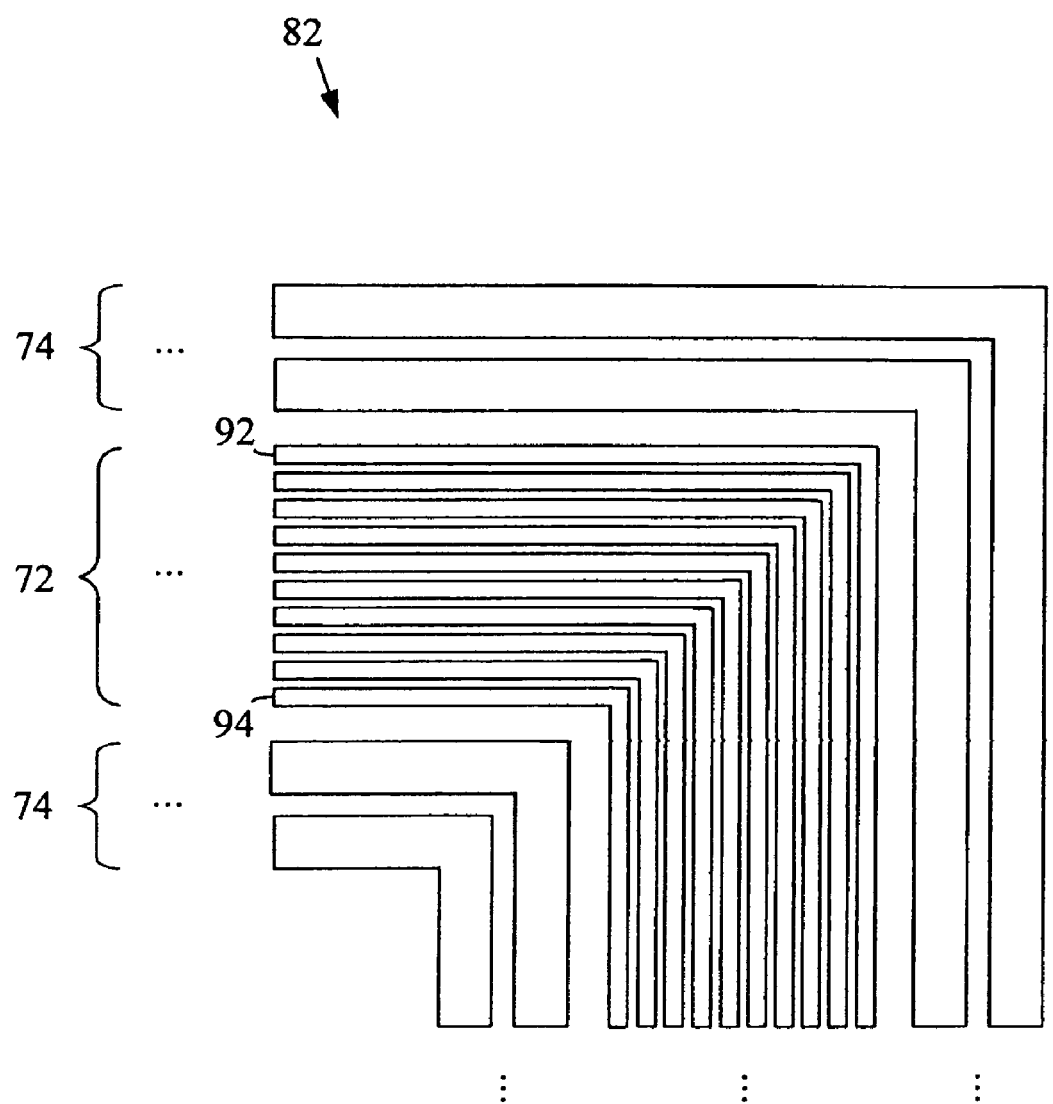
FIG. 5 is a magnified view of a 90 degree bend within the coupled inductor structure of FIG. 4 in accordance with an embodiment of the present invention.

FIG. 5 is a magnified view of the 90 degree bend 82 of FIG. 4. The other 90 degree bends 80, 84, 86 in FIG. 4 may be similar to bend 82. As shown, the bend 82 includes the parallel strips of the first inductor 72 on the first metallization layer and the parallel strips of the second inductor 74 on the second metallization layer. The 90 degree bend 82, by itself, produces an inequality between the lengths of the various strips. For example, an outermost strip 92 on the first metallization layer will be longer than an outermost strip 94 on the first metallization layer as a result of the bend 82. However, in one aspect of the present invention, techniques are presented for appropriately combining 90 degree bends of the type illustrated in FIG. 5 within a coupled inductor arrangement to achieve equal lengths between the various strips. This is achieved by including the same number of 90 degree bends within a coupled inductor arrangement that have one side of the parallel strips on the inside of the bend as the number of 90 degree bends that have the other side of the strips on the inside of the bend. For example, referring back to FIG. 4, the coupled inductor structure 70 includes the same number of 90 degree bends that have side 88 of the inductors 72, 74 on the inside of the bend (i.e., bends 80, 86) as the number of 90 degree bends that have side 90 of the inductors 72, 74 on the inside of the bend (i.e., bends 82, 84). In this manner, any length differences are cancelled out. The same technique may be extended to coupled inductor structures having bands with other angular values (e.g., 45 degrees, etc.). That is, for every bend of θ degrees having one side of the parallel strips on the inside of the bend there must be another bend of θ degrees having the other side of the parallel strips on the inside of the bend. Coupled inductor structures having bends of multiple different angular values (e.g., some 90 degree bends, some 45 degree bends, etc.) may also be implemented as long as the above criterion is satisfied.

Figure 6:
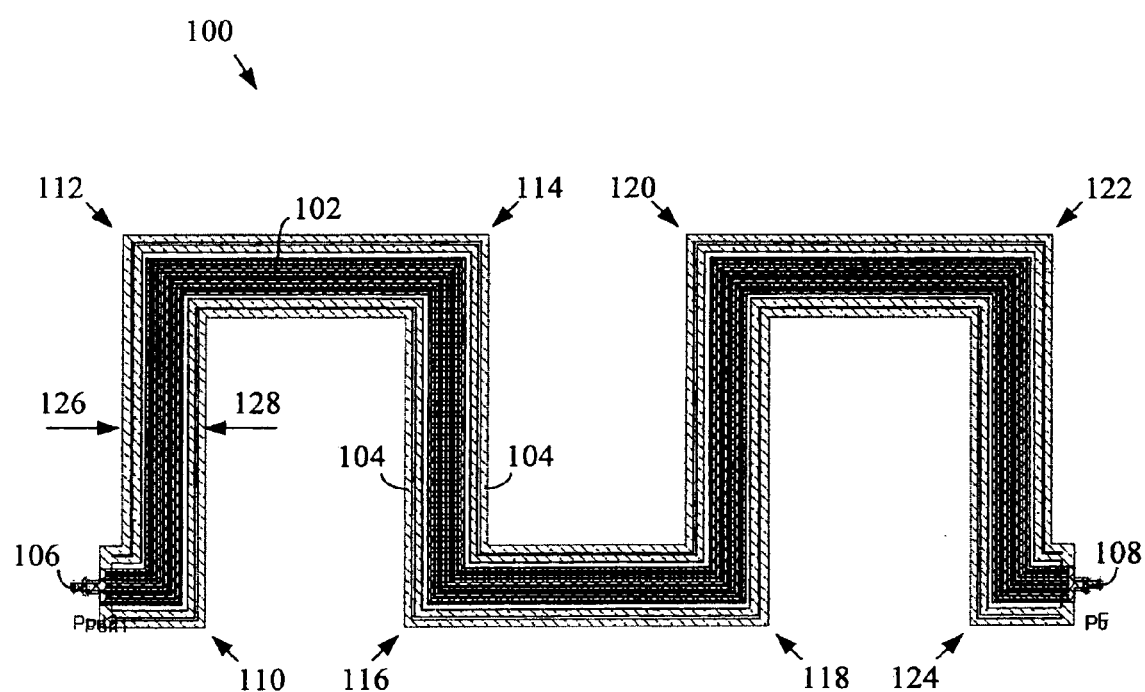
FIG. 6 is a top view of yet another exemplary coupled inductor structure in accordance with an embodiment of the present invention.

FIG. 6 is a top view of yet another exemplary coupled inductor structure 100 in accordance with an embodiment of the present invention. The coupled inductor 100 includes a first inductor 102 having multiple parallel strips on a first metallization layer and a second inductor 104 having multiple parallel strips on a second metallization layer. Terminals 106, 108 of the first and second inductors 102, 104 are located at opposite ends thereof (on respective metallization layers). As shown, the coupled inductor structure 100 has eight 90 degrees bends 110, 112, 114, 116, 118, 120, 122, 124. Four of the 90 degree bends 110, 116, 118, 124 have side 126 on the inside of the bend and four of the 90 degree bends 112, 114, 120, 122 have side 128 on the inside of the bend. In this manner, all of the strips within the first inductor 102 have the same length and all of the strips within the second inductor 104 have the same length.

Figure 7:
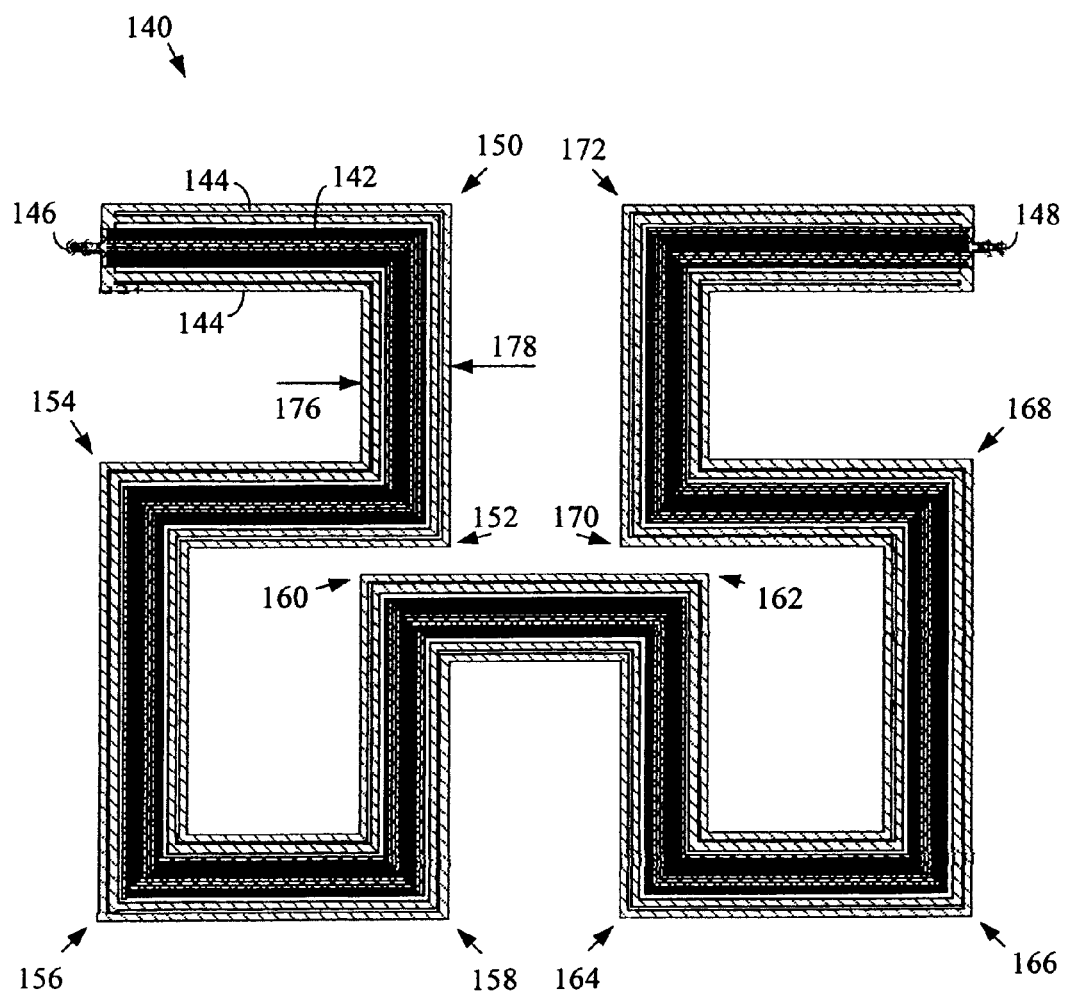
FIG. 7 is a top view of still another exemplary coupled inductor structure in accordance with an embodiment of the present invention.

FIG. 7 is a top view of still another exemplary coupled inductor structure 140 in accordance with an embodiment of the present invention. The coupled inductor 140 includes a first inductor 142 having multiple parallel strips on a first metallization layer and a second inductor 144 having multiple parallel strips on a second metallization layer. Terminals 146, 148 of the first and second inductors 142, 144 are located at opposite ends thereof (on respective metallization layers). As shown, the coupled inductor structure 100 has twelve 90 degrees bends 150, 152, 154, 156, 158, 160, 162, 164, 166, 168, 170, 172. Six of the 90 degree bends 150, 152, 160, 162, 170, 172 have side 176 on the inside of the bend and six of the 90 degree bends 154, 156, 158, 164, 166, 168 have side 178 on the inside of the bend. In this manner, all of the strips within the first inductor 142 have the same length and all of the strips within the second inductor 144 have the same length.

In the embodiments described above, both the upper and the lower conductors of the coupled inductor structures discussed utilize parallel strips as a means to reduce current crowding. In at least one embodiment, however, parallel strips are used on one metallization layer and not on the other. For example, the upper layer may use parallel strips and the lower layer may use a single conductor strip. Other arrangements are also possible.

Figure 8:
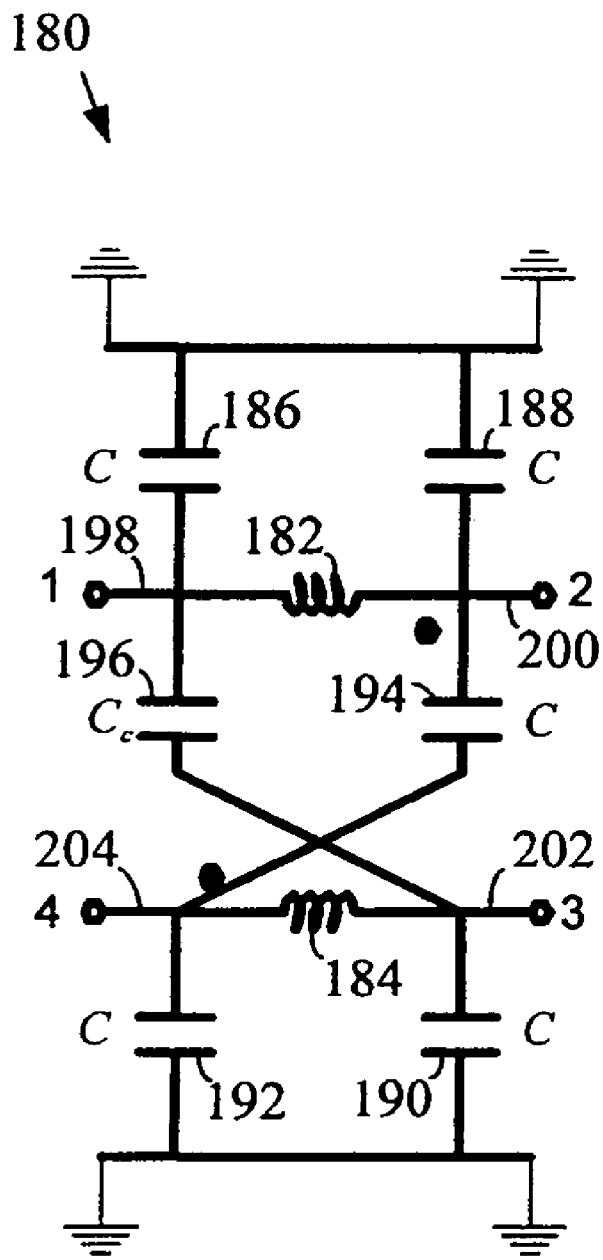
FIG. 8 is a circuit schematic illustrating a quadrature hybrid coupler that includes a coupled inductor in accordance with an embodiment of the present invention.

Coupled inductors may be used to form a variety of different circuit components that may be used as building blocks in radio frequency (RF) systems. For example, coupled inductors can be used to form transformers, quadrature hybrid couplers (quad hybrids), filters, and other components. FIG. 8 is a circuit schematic illustrating a quadrature hybrid coupler 180 that includes a coupled inductor in accordance with an embodiment of the present invention. The quad hybrid 180 may be implemented on-die within a microelectronic device. As shown, the quad hybrid 180 includes first and second coupled inductors 182, 184 and six capacitors 186, 188, 190, 192, 194, 196. The quad hybrid 180 is a four port device having a first port 198 coupled to one side of the first inductor 182, a second port 200 coupled to the opposite side of the first inductor 182, a third port 202 coupled to one side of the second inductor 184, and a fourth port 204 coupled to the opposite side of the second inductor 184. The dots adjacent to the coupled inductors 182, 184 are indicative of the relative polarities of the inductors. First, second, third, and fourth capacitors 186, 188, 190 192 are located between respective ports 198, 200, 202, 204 and ground. A fifth capacitor 194 is located between the second port 200 and the fourth port 204 and a sixth capacitor 196 is located between the first port 198 and the third port 202. The first, second, third, and fourth ports 198, 200, 202, 204 each have a characteristic impedance $Z_0$. The quad hybrid 10 is to operate at a center frequency $\omega_0$. To achieve the characteristic impedance $Z_0$ and the center frequency $\omega_0$, the first, second, third, fourth, and fifth capacitors 186, 188, 190 192, 194, each have a capacitance of $$C = \frac{1}{(1+\sqrt{2})Z_0\omega_0}.$$

The sixth capacitor 196 has a capacitance of $$C_c = \frac{1}{Z_0\omega_0}.$$

The coupled inductors 182, 184 each have an inductance of $$L = \frac{\sqrt{2}\,Z_0}{\omega_0}.$$

During operation, an RF signal applied to the first port 28 of the quad hybrid 10 will result in equal amplitude signals, having a 90 degree phase difference, at the third and fourth ports 32, 34. Any reflections back into the hybrid 10 caused by mismatches associated with the third and fourth ports 32, 34 will emerge from the second port 30 of the quad hybrid 10. As can be appreciated, a quad hybrid coupler may be used in many different applications within an RF based system.

Figure 9:
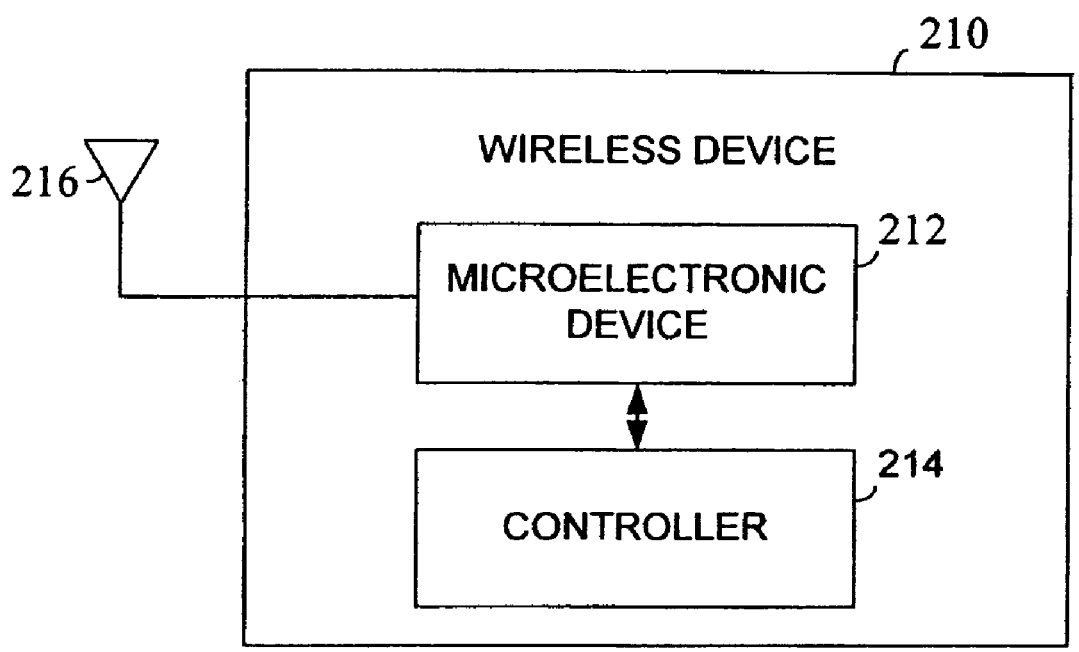
FIG. 9 is a block diagram illustrating an exemplary wireless device in accordance with an embodiment of the present invention.

Microelectronic devices that include coupled inductor structures in accordance with the present invention may be used in a wide variety of different components, devices, and systems. Because the coupled inductor structures can reduce or eliminate the occurrence of current crowding, they are particularly well suited for higher power applications, such as within power amplifiers and the like (although they may also be used in lower power applications). FIG. 9 is a block diagram illustrating an exemplary wireless device 210 in accordance with an embodiment of the present invention. The wireless device 210 comprises a microelectronic device 212 that includes one or more of the inventive coupled inductor structures. The wireless device 210 may be any form of wireless device including, for example, a computer having wireless networking functionality, a personal digital assistant (PDA) having wireless networking functionality, a cellular telephone or other handheld wireless communicator, a pager, a wireless network interface card or other wireless network interface structure, and/or others. As shown, the microelectronic device 212 may be coupled to one or more antennas 216 to provide a transition to an external wireless channel. The microelectronic device 212 may include, for example, a packaged chip having a radio frequency (RF) transmitter, an RF receiver, an RF transceiver, and/or other RF circuitry. A digital controller 214 may also be provided within the wireless device 210 to control the operation of the device. Microelectronic devices that include one or more of the inventive coupled inductor structures may also be used in other types of devices and systems including, for example, devices that transmit to and/or receive from an external wired medium.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A microelectronic device, comprising:
a coupled inductor structure including:
    a first inductor on a first metallization layer of a microelectronic die; and
    a second inductor, that is inductively coupled to said first inductor, on a second metallization layer of said microelectronic die, said second inductor having a first inductor portion having a first plurality of parallel strips, a second inductor portion having a second plurality of parallel strips, and a bend portion to conductively couple said first inductor portion to said second inductor portion, said bend portion including:
        a single strip forming a 90 degree bend, said single strip having a first end and a second end;
        a first conductive block having a first edge and a second edge, said first edge being connected to said first end of said single strip and said second edge being connected to an end of said first plurality of parallel strips, wherein said second edge is substantially perpendicular to said parallel strips in said first plurality of parallel strips; and
        a second conductive block having a third edge and a fourth edge, said third edge being connected to said second end of said single strip and said fourth edge being connected to an end of said second plurality of parallel strips, wherein said fourth edge is substantially perpendicular to said parallel strips in said second plurality of parallel strips;
    wherein said strips in said first plurality of parallel strips have substantially the same length as one another and said strips in said second plurality of parallel strips have substantially the same length as one another.

2. The microelectronic device of claim 1, wherein said second inductor further comprises:
    a third conductive block having a fifth edge and a sixth edge, said fifth edge being connected to another end of said first plurality strips, wherein said fifth edge is substantially perpendicular to said first plurality of parallel strips; and
    a fourth conductive block having a seventh edge and an eighth edge, said seventh edge being connected to another end of said second plurality of parallel strips, wherein said seventh edge is substantially perpendicular to said parallel strips in said second plurality of parallel strips.

3. The microelectronic device of claim 1, wherein:
said first conductive block is substantially rectangular.

4. The microelectronic device of claim 1, wherein:
said first inductor on said first metallization layer of said microelectronic die includes a third inductor portion having a third plurality of parallel strips, a fourth inductor portion having a fourth plurality of parallel strips, and a second bend portion to conductively couple said third plurality of parallel strips to said fourth plurality of parallel strips, said second bend portion including:
    a second single strip forming a 90 degree bend, said second single strip having a first end and a second end;
    a fifth conductive block having a ninth edge and a tenth edge, said ninth edge being connected to said first end of said second single strip and said tenth edge being connected to an end of said third plurality of parallel strips, wherein said tenth edge is substantially perpendicular to said parallel strips in said third plurality of parallel strips; and
    a sixth conductive block having a eleventh edge and a twelfth edge, said eleventh edge being connected to said second end of said second single strip and said twelfth edge being connected to an end of said fourth plurality of parallel strips, wherein said twelfth edge is substantially perpendicular to said parallel strips in said fourth plurality of parallel strips:
wherein said strips in said third plurality of parallel strips have substantially the same length as one another and said strips in said fourth plurality of parallel strips have substantially the same length as one another.

5. The microelectronic device of claim 1, wherein said second inductor further includes:
    at least one additional inductor portion in addition to said first inductor portion and said second inductor portion, said at least one additional inductor portion including a plurality of parallel strips; and
    at least one additional bend portion to conductively couple said at least one additional inductor portion to another inductor portion associated with said second inductor.

6. A microelectronic device, comprising:
a coupled inductor structure including:
    a first inductor on a first metallization layer of a microelectronic die; and
    a second inductor, that is inductively coupled to said first inductor, on a second metallization layer of said microelectronic die, said second inductor having a first inductor portion having a first plurality of parallel strips, a second inductor portion having a second plurality of parallel strips, and a bend portion to conductively couple said first inductor portion to said second inductor portion, said bend portion including:
        a single strip forming a 90 degree bend, said single strip having a first end and a second end;
        a first transition portion between said first end of said single strip and an end of said first plurality of parallel strips, said first transition portion having a number of one-to-two splits that start at said first end of said single strip and end at said first plurality of parallel strips; and
        a second transition portion between said second end of said single strip and an end of said second plurality of parallel strips, said second transition portion having a number of one-to-two splits that start at said second end of said single strip and end at said second first plurality of parallel strips.

7. The microelectronic device of claim 6, wherein:
said number of one-to-two splits in said first transition portion includes a feed point for each split that is halfway between the outermost strips that are fed by the split.

8. The microelectronic device of claim 6, wherein:
said first transition portion provides substantially the same path length from said first end of said single strip to a point on each of said parallel strips in said first plurality of parallel strips that lies on a single straight line running perpendicularly through said first plurality of parallel strips.

9. The microelectronic device of claim 6, wherein:
said first plurality of parallel strips includes an even number of parallel strips.

10. The microelectronic device of claim 6, wherein:
said first inductor includes a third inductor portion having a third plurality of parallel strips, a fourth inductor portion having a fourth plurality of parallel strips, and a second bend portion to conductively couple said third inductor portion to said fourth inductor portion, said second bend portion including:
a second single strip forming a 90 degree bend, said second single strip having a first end and a second end;
a third transition portion between said first end of said second single strip and an end of said third plurality of parallel strips, said third transition portion having a number of one-to-two splits that start at said first end of said second single strip and end at said third plurality of parallel strips; and
a fourth transition portion between said second end of said second single strip and an end of said fourth plurality of parallel strips, said fourth transition portion having a number of one-to-two splits that start at said second end of said second single strip and end at said fourth plurality of parallel strips.

11. The microelectronic device of claim 10, wherein:
said third plurality of parallel strips has a different number of parallel strips than said first plurality of parallel strips.

12. The microelectronic device of claim 6, wherein said second inductor further includes:
at least one additional inductor portion in addition to said first inductor portion and said second inductor portion, said at least one additional inductor portion including a plurality of parallel strips; and
at least one additional bend portion to conductively couple said at least one additional inductor portion to another inductor portion associated with said second inductor.

13. A wireless device comprising:
a microelectronic device having a coupled inductor structure including:
a first inductor on a first metallization layer of a microelectronic die; and
a second inductor, that is inductively coupled to said first inductor, on a second metallization layer of said microelectronic die, said second inductor having a first inductor portion having a first plurality of parallel strips, a second inductor portion having a second plurality of parallel strips, and a bend portion to conductively couple said first inductor portion to said second inductor portion, said bend portion including:
a single strip forming a 90 degree bend, said single strip having a first end and a second end; and
a first conductive block having a first edge and a second edge, said first edge being connected to said first end of said single strip and said second edge being connected to an end of said first plurality of parallel strips, wherein said second edge is substantially perpendicular to said parallel strips in said first plurality of parallel strips; and
a second conductive block having a third edge and a fourth edge, said third edge being connected to said second end of said single strip and said fourth edge being connected to an end of said second plurality of parallel strips, wherein said fourth edge is substantially perpendicular to said parallel strips in said second plurality of parallel strips; and
at least one antenna coupled to said microelectronic device to provide a transition between circuitry within said microelectronic device and a wireless channel.

14. The wireless device of claim 13, further comprising:
a digital controller coupled to said microelectronic device.

15. The wireless device of claim 13, wherein said second inductor further comprises:
a third conductive block having a fifth edge and a sixth edge, said fifth edge being connected to another end of said first plurality of parallel strips, wherein said fifth edge is substantially perpendicular to said parallel strips in said first plurality of parallel strips; and
a fourth conductive block having a seventh edge and an eighth edge, said seventh edge being connected to another end of said second plurality of parallel strips, wherein said seventh edge is substantially perpendicular to said parallel strips in said second plurality of parallel strips.

16. The wireless device of claim 13, wherein:
said first inductor on said first metallization layer of said microelectronic die includes a third inductor portion having a third plurality of parallel strips, a fourth inductor portion having a fourth plurality of parallel strips, and a bend portion to conductively couple said third plurality of parallel strips to said fourth plurality of parallel strips, said bend portion including:
a second single strip forming a 90 degree bend, said second single strip having a first end and a second end;
a fifth conductive block having a ninth edge and a tenth edge, said ninth edge being connected to said first end of said second single strip and said tenth edge being connected to an end of said third plurality of parallel strips, wherein said tenth edge is substantially perpendicular to said parallel strips in said third plurality of parallel strips; and
a sixth conductive block having a eleventh edge and a twelfth edge, said eleventh edge being connected to said second end of said second single strip and said twelfth edge being connected to an end of said fourth plurality of parallel strips, wherein said twelfth edge is substantially perpendicular to said parallel strips in said fourth plurality of parallel strips.

17. A wireless device comprising:
a microelectronic device having a coupled inductor structure including:
a first inductor on a first metallization layer of a microelectronic die; and
a second inductor, that is inductively coupled to said first inductor, on a second metallization layer of said microelectronic die, said second inductor having a first inductor portion having a first plurality of parallel strips, a second inductor portion having a second plurality of parallel strips, and a bend portion to conductively couple said first inductor portion to said second inductor portion, said bend portion including:
a single strip forming a 90 degree bend, said single strip having a first end and a second end;

a first transition portion between said first end of said single strip and an end of said first plurality of parallel strips, said first transition portion having a number of one-to-two splits that start at said first end of said single strip and end at said first plurality of parallel strips; and at least one antenna coupled to said microelectronic device to provide a transition between circuitry within said microelectronic device and a wireless channel.

18. The wireless device of claim 17, wherein:

said bend portion further includes a second transition portion between said second end of said single strip and an end of said second plurality of parallel strips, said second transition portion having a number of one-to-two splits that start at said second end of said single strip and end at said second first plurality of parallel strips.

19. The wireless device of claim 17, wherein:

said first transition portion provides substantially the same path length from said first end of said single strip to a point on each of said parallel strips in said first plurality of parallel strips that lies on a single straight line running perpendicularly through said first plurality of parallel strips.

20. The wireless device of claim 17, wherein:

said first inductor includes a third inductor portion having a third plurality of parallel strips, a fourth inductor portion having a fourth plurality of parallel strips, and a bend portion to conductively couple said third inductor portion to said fourth inductor portion, said bend portion including:

a second single strip forming a 90 degree bend, said second single strip having a first end and a second end;

a third transition portion between said first end of said second single strip and an end of said third plurality of parallel strips, said third transition portion having a number of one-to-two splits that start at said first end of said second single strip and end at said third plurality of parallel strips; and a fourth transition portion between said second end of said second single strip and an end of said fourth plurality of parallel strips, said fourth transition portion having a number of one-to-two splits that start at said second end of said second single strip and end at said fourth plurality of parallel strips.

21. The wireless device of claim 17, wherein:

said number of one-to-two splits in said first transition portion includes a feed point for each split that is halfway between the outermost strips that are fed by the split.

* * * * *